United States Patent
Kwon et al.

(10) Patent No.: US 7,619,315 B2
(45) Date of Patent: Nov. 17, 2009

(54) STACK TYPE SEMICONDUCTOR CHIP PACKAGE HAVING DIFFERENT TYPE OF CHIPS AND FABRICATION METHOD THEREOF

(75) Inventors: Woon-Seong Kwon, Gyeonggi-do (KR); Yong-Hwan Kwon, Gyeonggi-do (KR); Un-Byoung Kang, Gyeonggi-do (KR); Chung-Sun Lee, Gyeonggi-do (KR); Hyung-Sun Jang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 48 days.

(21) Appl. No.: 11/952,426

(22) Filed: Dec. 7, 2007

(65) Prior Publication Data
US 2008/0169546 A1    Jul. 17, 2008

(30) Foreign Application Priority Data
Jan. 15, 2007    (KR) .......................... 2007-0004412

(51) Int. Cl.
*H01L 21/56* (2006.01)
(52) U.S. Cl. .................. 257/777; 257/723; 257/433; 257/E23.01
(58) Field of Classification Search .............. 257/686, 257/737, 777, 723, 433, E23.01, E21.5
See application file for complete search history.

(56) References Cited

U.S. PATENT DOCUMENTS 5,633,530 A * 5/1997 Hsu .......................... 257/685
5,869,896 A * 2/1999 Baker et al. ................ 257/724
6,424,031 B1 * 7/2002 Glenn ........................ 257/686
6,559,539 B2   5/2003 Tu et al.
6,882,021 B2   4/2005 Boon et al.

FOREIGN PATENT DOCUMENTS

KR   2003-0057203   7/2003
KR   2006-0005720   1/2006

OTHER PUBLICATIONS

English language abstract of Korean Publication No. 2003-0057203.
English language abstract of Korean Publication No. 2006-0005720.

* cited by examiner

*Primary Examiner*—Roy K Potter
(74) *Attorney, Agent, or Firm*—Marger Johnson & McCollom, P.C.

(57) ABSTRACT

A stack type semiconductor chip package includes a first wafer mold, a protection substrate, and a second wafer mold that are stacked in a wafer level process. The first wafer mold includes a first chip having first pads and a first mold layer encapsulating the first chip. The protection substrate is placed on the first wafer mold, is mechanically bonded with the first wafer mold using a first adhesive layer, and includes wiring layers facing the first pads. The second wafer mold is placed under the first wafer mold, is mechanically bonded with the first wafer mold using a second adhesive layer, and includes a second chip having second pads, and a second mold layer encapsulating the second chip. First vias electrically connect the wiring layers of the protection substrate with the second pads. Second vias electrically connect the wiring layers of the protection substrate with external connection terminals.

11 Claims, 8 Drawing Sheets

STACK TYPE SEMICONDUCTOR CHIP PACKAGE HAVING DIFFERENT TYPE OF CHIPS AND FABRICATION METHOD THEREOF

CROSS-REFERENCE TO RELATED PATENT APPLICATION

This application claims priority under 35 USC § 119 to Korean Patent Application No. 10-2007-0004412, filed on Jan. 15, 2007 in the Korean Intellectual Property Office, the disclosure of which is incorporated herein in its entirety by reference.

BACKGROUND

1. Technical Field

The present invention relates to a stack type semiconductor chip package and a fabrication method thereof, and more particularly, to a stack type semiconductor chip package having different types of chips, and a fabrication method thereof.

2. Description of the Related Art

As a variety of semiconductor products are developed, a stack type semiconductor chip package (for instance, a multichip package (MCP)) or a system in package (SIP), including different types of chips stacked on top of one another, are being used for a semiconductor package.

Figure 1:
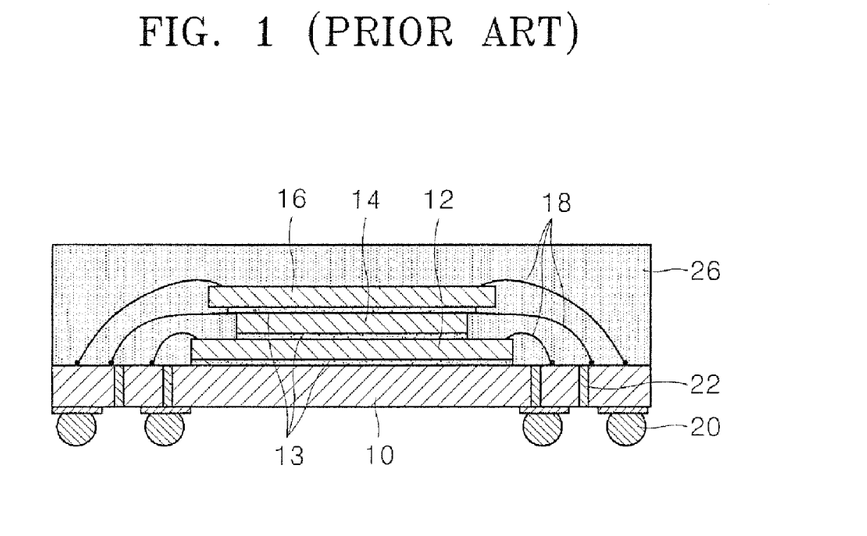
FIG. 1 is a cross-sectional view illustrating one example of a conventional stack type semiconductor chip package.

FIG. 1 is a cross-sectional view illustrating one example of a conventional stack type semiconductor chip package.

Specifically, the conventional stack type semiconductor chip package includes different types of chips 12, 14 and 16 stacked on a printed circuit board (PCB) 10 and on top of one another, using adhesive layers 13. The different types of chips 12, 14 and 16 have different functions and sizes, and may be memory circuit chips or logic circuit chips. The different types of chips 12, 14 and 16 are electrically connected to the PCB 10 using bonding wires 18. Thus, the different types of chips 12, 14 and 16 are indirectly connected to one another using the PCB 10. The different types of chips 12, 14 and 16 on the PCB 10, and the bonding wires 18 are encapsulated by an encapsulating material 26 such as an epoxy resin. Vias 22 are formed in the PCB 10, and are connected to solder balls 20, which are external connection terminals, through connection pads.

However, performance improvement of the conventional stack type semiconductor chip package of FIG. 1 is limited since the different types of chips 12, 14 and 16 are indirectly connected to one another through the PCB 10 using the bonding wires 18. Also, the connection of the different types of chips 12, 14 and 16 to the PCB 10 using the bonding wires 18 makes miniaturization of the package difficult. Furthermore, the stack type semiconductor chip package of FIG. 1 cannot be used as an image sensor chip package because image sensor chip packages are sensitive to impurity particles due to factors related to the packaging process.

Figure 2:
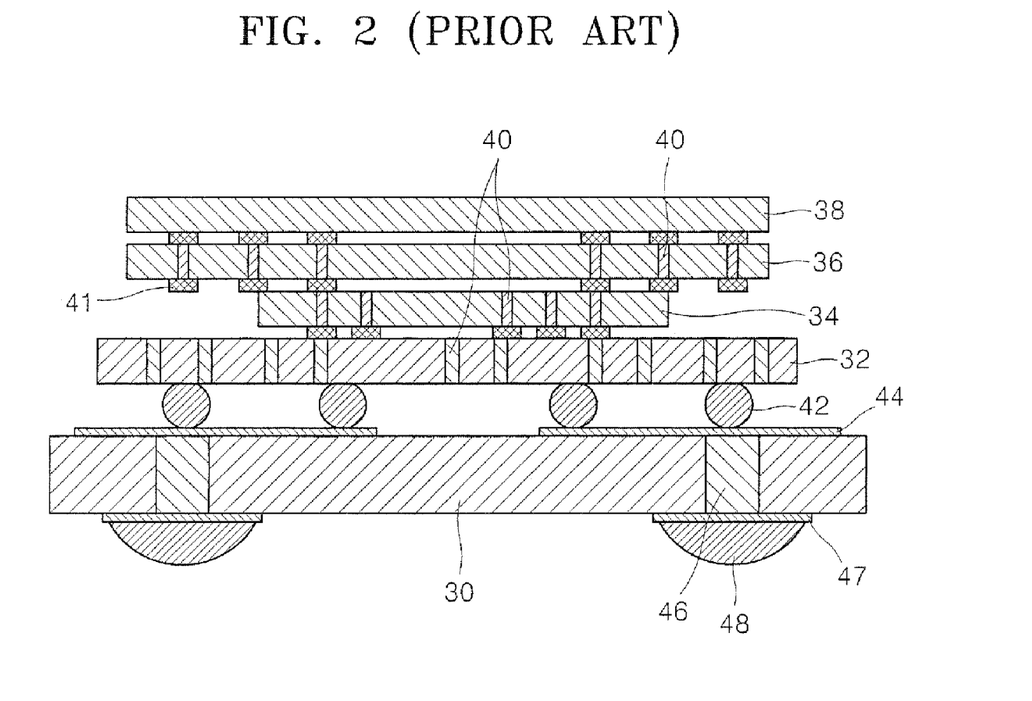
FIG. 2 is a cross-sectional view illustrating another example of a conventional stack type semiconductor chip package.

FIG. 2 is a cross-sectional view illustrating another example of a conventional stack type semiconductor chip package.

Specifically, the conventional stack type semiconductor chip package includes different types of chips 34, 36 and 38 on a PCB 30, using an interposer chip 32 interposed therebetween. The different types of chips 34, 36 and 38 have different functions and sizes, and may be memory circuit chips or logic circuit chips. The different types of chips 34, 36, and 38 are electrically connected to second pads 44 of the PCB 30 through first pads 41, first vias 40, and connection balls 42. Thus, the different types of chips 34, 36, and 38 are directly connected to one another through the first vias 40 and the first pads 41 that are formed in each chip. Particularly, the different types of chips 34, 36 and 38 are directly connected through the first vias 40 in the chips. The second pads 44 are connected to solder balls 48 through second vias 46 and third pads 47 in the PCB 30.

Unlike the stack type semiconductor chip package of FIG. 1, the stack type semiconductor chip package of FIG. 2 is advantageous in performance improvement and package miniaturization, since the different types of chips 34, 36, and 38 are directly connected without using the bonding wires. However, the stack type semiconductor chip package of FIG. 2 has an undesirably complex rewiring layout. Also, the first vias 40 in the different types of chips 34, 36 and 38 significantly lower a fabrication yield of the different types of chips. Additionally, the stack type semiconductor chip package of FIG. 2 must disadvantageously employ the interposer chip 32.

The stack type semiconductor chip package of FIG. 2 has many structural problems such as structural instability resulting from stacking larger chips 36 and 38 on a smaller chip 34. The stack type semiconductor chip package of FIG. 2 also cannot be used for an image sensor chip package that is sensitive to impurity particles such as dust because of factors related to the packaging process. The present invention addresses these and other disadvantages of the conventional art.

SUMMARY

The present invention provides a stack type semiconductor chip package that is applicable to an image sensor chip package, and can improve package performance and fabrication yield.

The present invention also provides a fabrication method for easily fabricating a stack type semiconductor chip package as described above.

According to an aspect of the present invention, there is provided a stack type semiconductor chip package including a first wafer mold, a protection substrate, and a second wafer mold that are stacked in a wafer level process. The first wafer mold includes a first chip having first pads on one surface, and a first mold layer surrounding and encapsulating the first chip. The protection substrate is placed on the first wafer mold, is mechanically bonded with the first wafer mold using a first adhesive layer interposed therebetween, and includes wiring layers on one surface facing the first pads to be electrically connected to the first wafer mold. The second wafer mold includes a second chip having second pads on one surface, and a second mold layer surrounding and encapsulating the second chip. First and second vias electrically connect the first and second chips, the protection substrate, and external connection terminals. Accordingly, the first and second chips are directly connected without bonding wires, thereby minimizing the package dimensions and increasing the fabrication yield compared to the conventional art. Also, a stack type semiconductor chip package according to the present invention is suitable for use as an image sensor chip package.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses and sizes of layers and regions are exaggerated for clarity.

A stack type semiconductor chip package according to embodiments of the present invention includes different types of chips stacked in a wafer level. The different types of chips have different functions and sizes, and may be a memory circuit chip, a logic circuit chip, an image sensor chip, and an image signal processor (ISP). Although two different types of chips are stacked in a present embodiment, stacking of more than two types of chips also falls within the scope of the present invention. Pad locations on the chips do not determine the scope of the present invention, and pads may be formed at central portions of the chips if necessary. Hereinafter, a top surface and a bottom surface of a specific element may be switched by a location change and thus terms such as top, bottom, upper, and lower should not be construed as indicating required spatial relationships.

Figure 3:
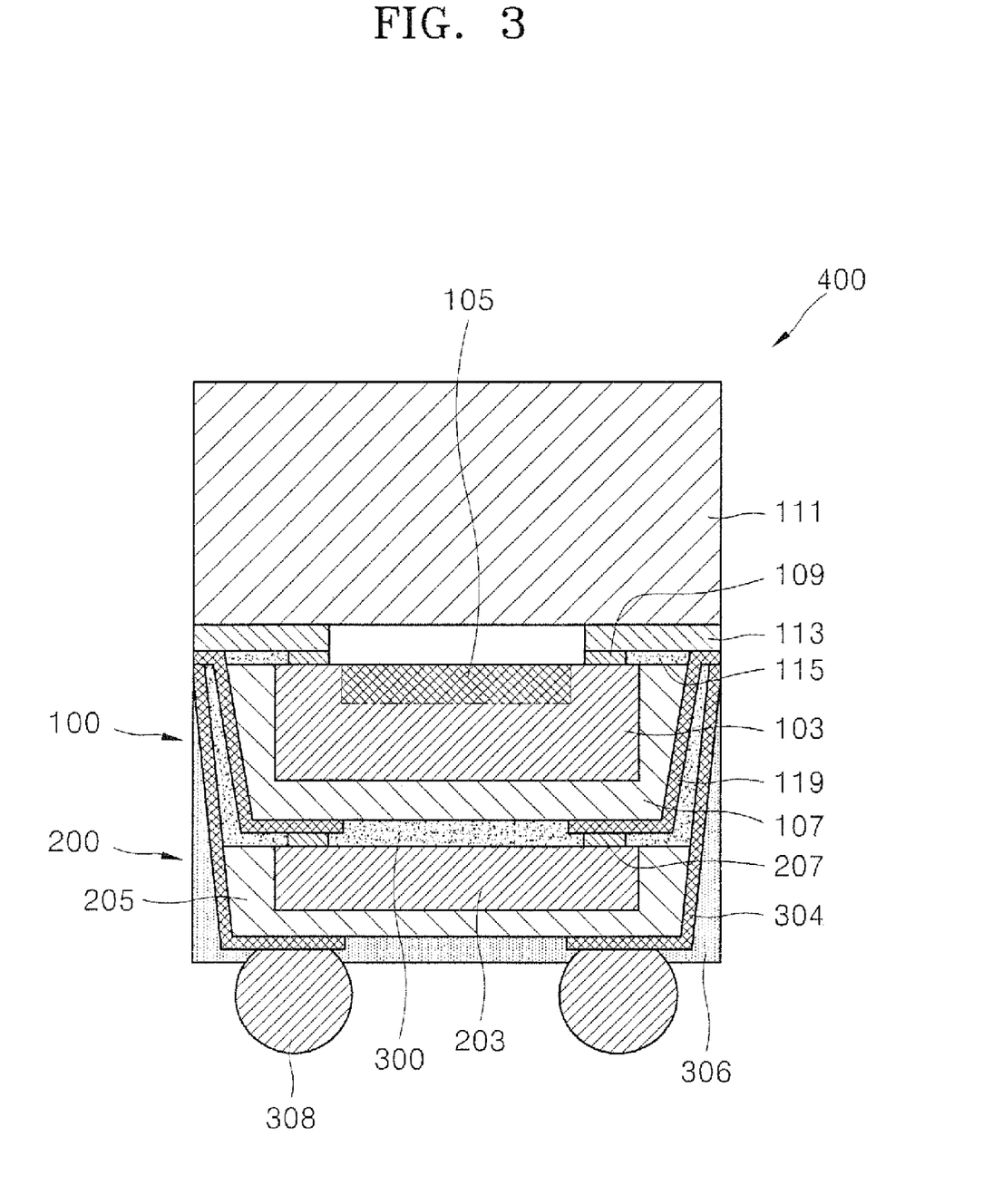
FIG. 3 is a cross-sectional view of a stack type semiconductor chip package according to an embodiment of the present invention.

FIG. 3 is a cross-sectional view of a stack type semiconductor chip package according to an embodiment of the present invention.

Specifically, a stack type semiconductor chip package 400 according to an embodiment of the present invention includes a first wafer mold 100, a protection substrate 111, and a second wafer mold 200 stacked in a wafer level process. A wafer level process is one in which a plurality of semiconductor chip packages are manufactured in wafer form and then the individual packages are separated by, for instance, a wafer dicing process. The first wafer mold 100 of the stack type semiconductor chip package 400 includes a first chip 103 having first pads 109 at one surface, and a first mold layer 107 surrounding and encapsulating the first chip 103. In the current embodiment, the first chip 103 is an image sensor chip. Thus, an image sensing unit 105 is arranged at a center portion of an upper surface of the first chip 103. The first pads 109 are placed at both sides of the image sensing unit 105 in order to send an electrical signal generated from the first chip 103 to the outside. If the first chip 103 is not an image sensor chip, the first pads 109 may be formed at the center portion of the first chip 103.

The protection substrate 111, having wiring layers 113 at one surface facing the first pads 109, is placed on the first wafer mold 100, and the first wafer mold 100 is mechanically bonded with the protection substrate 111 using a first adhesive layer 115. The first adhesive layer 115 may be a nonconductive film (NCF) or an anisotropic conductive film (ACF) on the wiring layers 113. The first pad 109 of the first wafer mold 100 and the wiring layer 113 are electrically connected together. The protection substrate 100 serves to protect a surface of the first wafer mold 100.

In the case where the first chip 103 is an image sensor chip, the protection substrate 111 is a transparent substrate, for example, a glass substrate. The protection substrate 111 may be coated with an infrared radiation blocking film (not shown). Light passing through the protection substrate 111 may be incident on the image sensing unit 105 of the first chip 103 in a state where the infrared radiation has been previously blocked by the infrared radiation blocking film.

The second wafer mold 200 is placed under the first wafer mold 100. The second wafer mold 200 includes a second chip 203 having second pads 207, and a second mold layer 205 surrounding and encapsulating the second chip 203. The second chip 203 may have a different chip size and function from those of the first chip 103. For example, if the first chip 103 is an image sensor chip, the second chip 203 may be an image signal processor. The second wafer mold 200 is mechanically bonded with the first wafer mold 100 using a second adhesive layer 300 interposed therebetween. The second adhesive layer 300 is placed between a bottom surface of the first wafer mold 100 and the second chip 203 of the second wafer mold 200, and may be a nonconductive film (NCF) or an anisotropic conductive film (ACF).

First vias 119 are formed to electrically connect the wiring layers 113 of the protection substrate 111 with the second pads 207 of the second wafer mold 200 along both sidewalls of the first wafer mold 100, respectively. The first vias 119 are formed on a bottom surface and both sidewalls of the first mold layer 107, and the wiring layers 113 of the protection substrate 111. Particularly, the first vias 119 of the present invention are not formed in the first chip 103. Thus, processes for forming a via in the first chip 103, that is, a via-hole forming process and a via forming process in the first chip 103 may be omitted, so that package performance can be considerably improved.

Second vias 304 are separated from the first vias 119 by the second adhesive layer 300, and electrically connect the wiring layers 113 of the protection substrate 111 with external connection terminals 308 along both sidewalls of the second wafer mold 200, respectively. The second vias 304 are spaced apart from the first vias 119, and are formed on both sidewalls of the first and second mold layers 107 and 205 of the first and second wafer molds 100 and 200, a bottom surface of the second mold layer 205, and the wiring layers 113 of the protection layer 111.

The external connection terminals 308 are solder balls or solder bumps. A solder resist layer 306 is formed on a bottom surface of the second mold layer 204 and on both sidewalls of the first and second mold layers 107 and 205 in order to insulate the second vias 304. The solder resist layer 306 is formed on outer sides of the second vias 304 formed on both sidewalls of the first and second wafer molds 100 and 200, and on the bottom surface of the second wafer mold 200.

Figure 4:
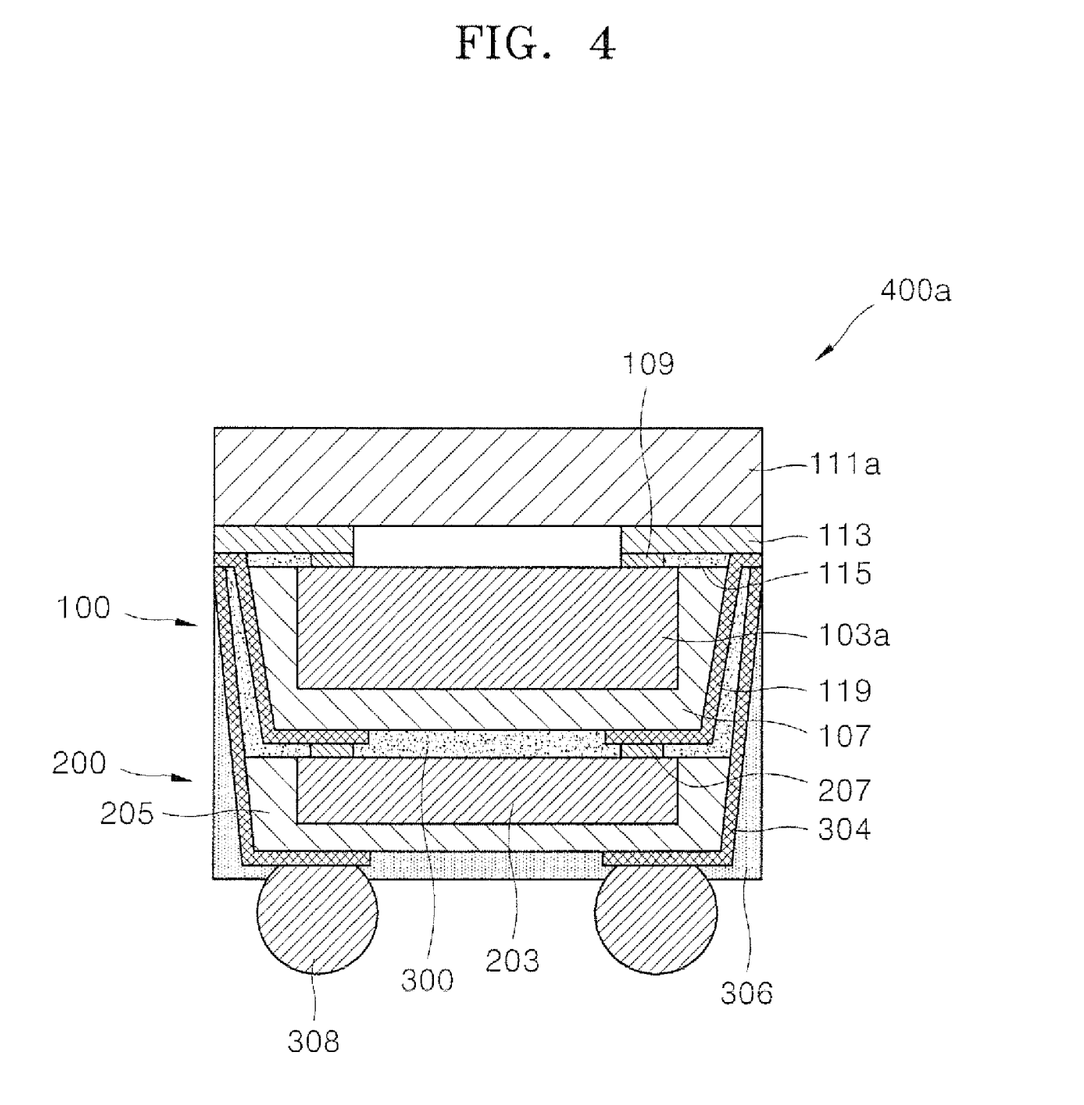
FIG. 4 is a cross-sectional view of a stack type semiconductor chip package according to another embodiment of the present invention.

FIG. 4 is a cross-sectional view of a stack type semiconductor chip package according to another embodiment of the present invention.

Specifically, the same reference numerals are used for the same members throughout FIGS. 3 and 4. In a stack type semiconductor chip package 400a according to another embodiment of the present invention, a first chip 103a is a memory circuit chip or a logic circuit chip, and a protection substrate 111a is a silicon substrate, not a transparent substrate. The stack type semiconductor chip package 400a of FIG. 4 is identical to the stack type semiconductor chip package 400 of FIG. 3, except for a thin thickness of the protection substrate 111a. Particularly, the stack type semiconductor chip package 400a of FIG. 4 is very advantageous in preventing soft errors caused by alpha particles since active surfaces (circuit surfaces) of the first and second chips 103a and 203 face upward.

An exemplary fabrication method of a stack type semiconductor chip package illustrated in FIG. 3 will now be described with reference to FIGS. 5 through 18.

FIGS. 5 through 10 are cross-sectional views illustrating a process of mechanically and electrically bonding a first wafer mold with a protection substrate in a fabrication method of a stack type semiconductor chip package according to an embodiment of the present invention.

Figure 5:
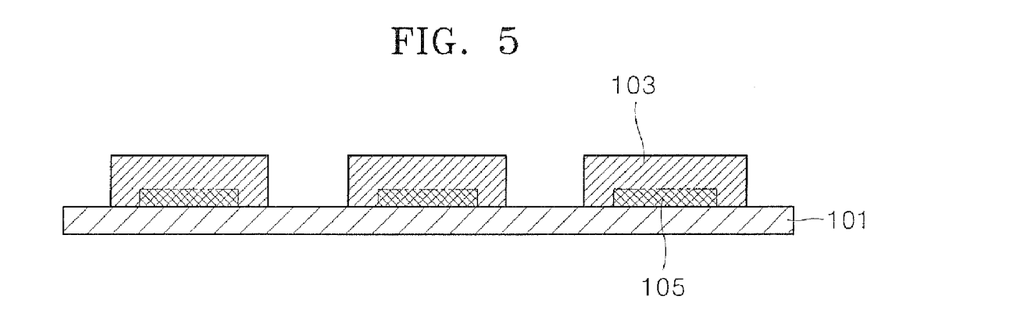
FIGS. 5 through 18 are cross-sectional views illustrating a fabrication method of a stack type semiconductor chip package according to an embodiment of the present invention.

Referring to FIG. 5, a plurality of first chips 103 are placed on a base film 101 with predetermined intervals therebetween. The first chips 103 are chips tested good through a chip fabrication process. Thus, defective chips are basically excluded from a packaging process in the present invention. As mentioned above, in the current embodiment, the first chips 103 are image sensor chips each including an image sensing unit 105 at the center of an upper surface.

Figure 6:
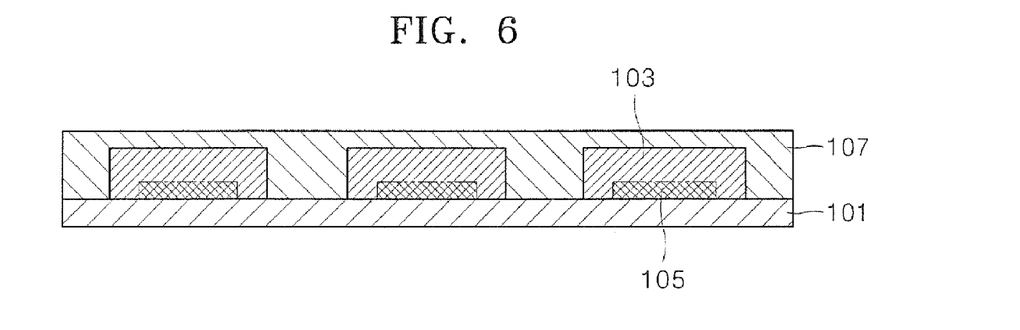
Figure 7:
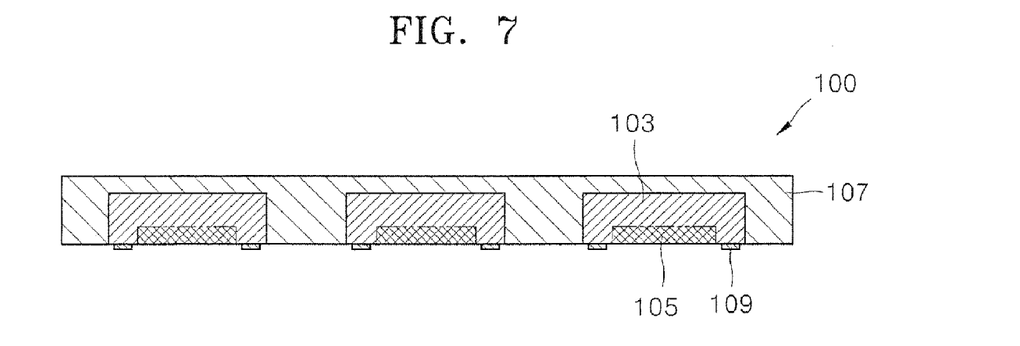

As illustrated in FIG. 6, a first mold layer 107 surrounding and encapsulating the first chips 103 is formed on the base film 101 and the first chips 103. The first mold layer 107 is formed using liquid molding or film lamination. A liquid epoxy resin and an epoxy resin film are used in the liquid molding or the film lamination, respectively. Thereafter, as illustrated in FIG. 7, the base film 101 is removed to expose first pads 109 (or first bumps) formed on one set of surfaces of the first chips 103, that is, on active surfaces, thereby forming a first wafer mold 100. The first pads 109 are placed at both sides of each image sensing unit 105. Of course, if the first chip 103 is not an image sensor chip, the first pads 109 may be formed at a center portion of the chip. A thickness of the first wafer mold 100 may be varied if necessary, and may be about 50 μm.

Figure 8:
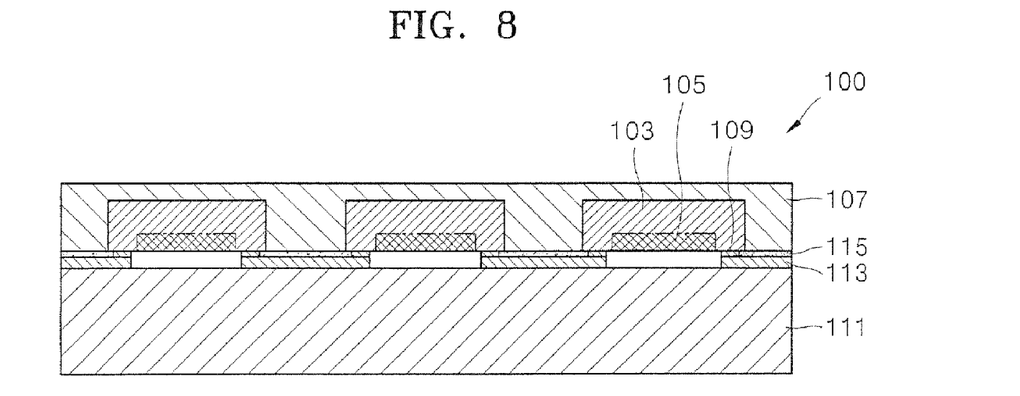

Referring to FIG. 8, a protection substrate 111 having wiring layers 113 at one surface facing the first pads 109 of the first wafer mold 100 is prepared. In the case where the first chips 103 are image sensor chips, the protection substrate 111 may be a transparent substrate, for example, a glass substrate with a thickness ranging from about 200 to 350 μm. If the first chips 103 are not the image sensor chips, the protection substrate 111 may be a silicon substrate. The protection substrate 111 has a wafer level size. For example, a diameter of the protection substrate 11 may vary from about 4 to 12 inches.

The wiring layers 113 are rewiring layers prepared so as to face the first pads 109 of the first wafer mold 100, and serve as input/output pads. The wiring layers 113 are formed by forming a plating layer on a seed metal layer and a seed metal layer on the protection substrate 111, and performing patterning through a photolithography process. The seed metal layer is formed by sputtering, for example, Ti/Cu or Ti/Ni, and the plating layer is formed by electroplating the seed metal layer with for example, Ni, Cu or Au.

The first wafer mold having the first pads 109 with one set of exposed surfaces is stacked on the protection substrate 111 including the wiring layers 113 in a wafer level, using a first adhesive layer 115 interposed therebetween. The first adhesive layer 115 may be a nonconductive film or an anisotropic conductive film used on the wiring layers 113. The first adhesive layer 115 may be a paste type or a film type.

The anisotropic conductive film of the first adhesive layer 115 may be formed of a different material depending on a pitch of the wiring layers (that is, input/output pads), and a contact area. Conductive particles included in the anisotropic conductive film are polymer balls coated with gold and having a diameter ranging from 5 to 20 μm, and metal balls having a diameter ranging from 5 to 20 μm. Thereafter, the protection substrate 111 and the first wafer mold 100 are mechanically bonded together by the first adhesive layer 115, using a wafer bonding apparatus, so that the first pads 109 are electrically connected with the wiring layers 113. Since the protection substrate 111 and the first wafer mold 100 are bonded and encapsulated, the stack type semiconductor chip package of the present invention may be protected from being contaminated by impurity particles such as dust.

Figure 9:
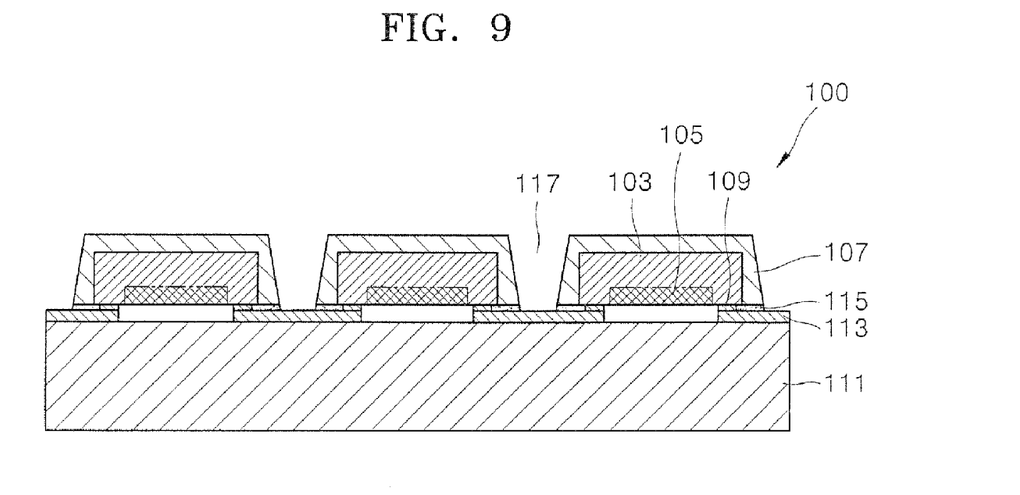

As illustrated in FIG. 9, the first mold layer 107 of the first wafer mold 100 and the first adhesive layer 115 are selectively etched to form first via holes 117 exposing the wiring layers 113. The selective etching of the first mold layer 107 and the first adhesive layer 115 is performed using laser processing, for example, an excimer laser process, or dry etching.

Figure 10:
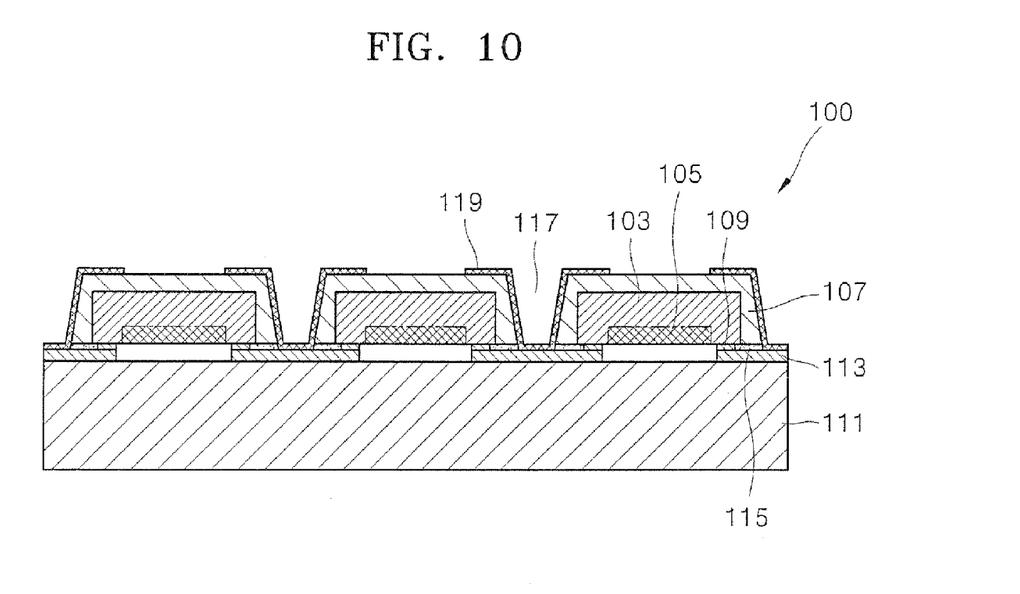

As illustrated in FIG. 10, first vias 119 are formed on inner surfaces of the first via holes 117 and portions of surfaces of the wiring layers 113 and the first mold layer 107. The first vias 119 are formed by forming a copper layer to a thickness of about 2 to 5 μm through electroless plating, and patterning the copper layer by a photolithography process. Accordingly, the wiring layers 113 and the first vias 119 are electrically connected.

In the present invention, the vias 119 are formed on the first mold layer 107, not in the first chips 103. Consequently, a process for forming vias in first chips, that is, a via-hole forming process and a via forming process, can be omitted, and thus package performance can be significantly improved.

Figure 11:
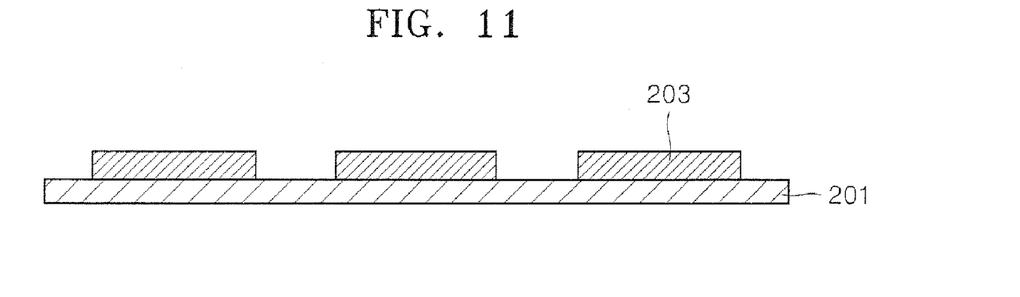
Figure 12:
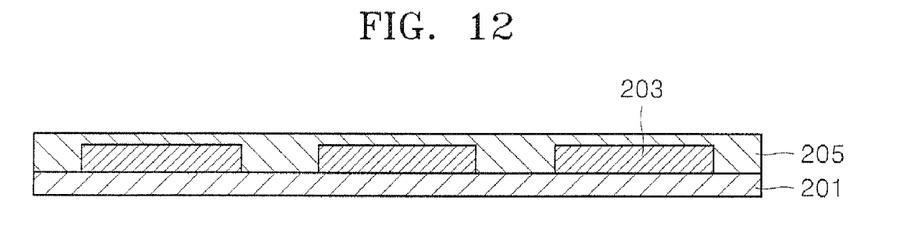
Figure 13:
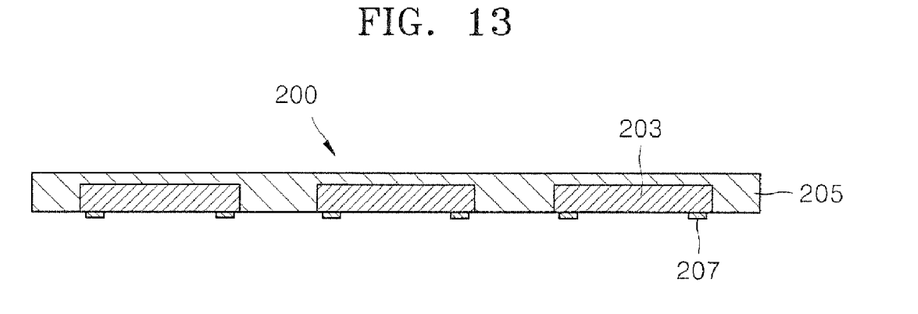

FIGS. 11 through 13 are cross-sectional views of a process of forming a second wafer mold in a fabrication method of a stack type semiconductor chip package according to an embodiment of the present invention.

Specifically, a second wafer mold 200 of FIGS. 11 through 13 is formed in the same manner as described with reference to FIGS. 5 through 7. However, second chips 203 of the second wafer mold 200 are different types of chips with different functions and sizes from those of the first chips 103 of the first wafer mold 100.

Referring to FIG. 1, a plurality of second chips 203 are placed on a base film 201 with predetermined intervals therebetween. The second chips 203 are chips tested good through a chip fabrication process. Accordingly, in the present invention, defective chips are basically excluded from the packaging process. The second chips 203 are different types of chips with different functions and sizes from the first chips 103, and may be memory circuit chips, logic circuit chips, or image sensor chips. If the first chips 103 are image sensor chips, then the second chips 203 are image signal processor chips used to drive the first chips 103 after packaging.

As illustrated in FIG. 12, a second mold layer 205 surrounding and encapsulating the second chips 203 is formed on a base film 201 and the second chips 203. The second mold layer 205 is formed using liquid molding or film lamination. A liquid epoxy resin and an epoxy resin film are used for the liquid molding and the film lamination, respectively.

Thereafter, as illustrated in FIG. 13, the base film 201 is removed to expose second pads 207 formed on one set of surfaces of the second chips, thereby forming a second wafer mold 200. The second pads 207 are formed at both sides of an upper surface of each chip 203. Of course, if the second chip 203 is not the image sensor chip, the second pads 207 may be formed at a center portion of the chip.

FIGS. 14 through 18 are cross-sectional views of a process of mechanically and electrically bonding the first wafer mold bonded onto the protection substrate, and the second wafer mold in a stack type semiconductor chip package according to an embodiment of the present invention.

Figure 14:
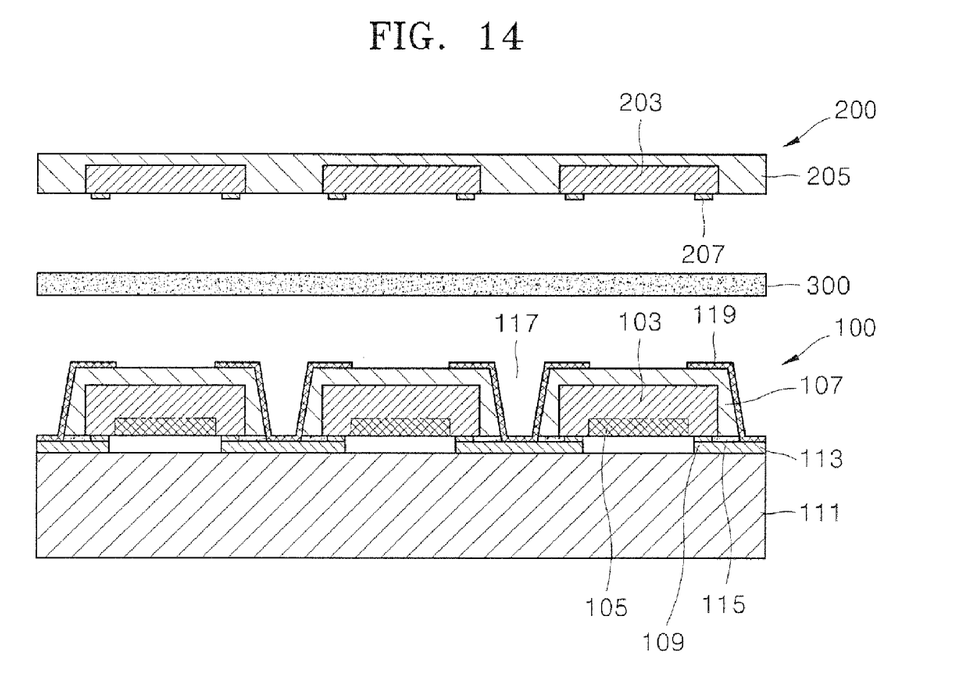

As illustrated in FIG. 14, the second wafer mold 200 is stacked on the first wafer mold 100 bonded on the protection substrate 111 in a wafer level process, using a second adhesive layer 300 interposed therebetween. The second adhesive layer 300 may be a nonconductive film, or an anisotropic conductive film. Of course, the second adhesive layer 300 may be a paste type or a film type. The anisotropic conductive film of the second adhesive layer 300 may be formed of a different material depending on a pitch of first vias 119 or wiring layers 113, and a contact area. Conductive particles of the anisotropic conductive film may be polymer balls coated with gold and having a diameter ranging from about 5 to 20 µm, or metal balls having a diameter ranging from about 5 to 20 µm. A thickness of the second adhesive layer 300 may be varied if necessary, but approximately ranges from 20 to 80 µm.

Figure 15:
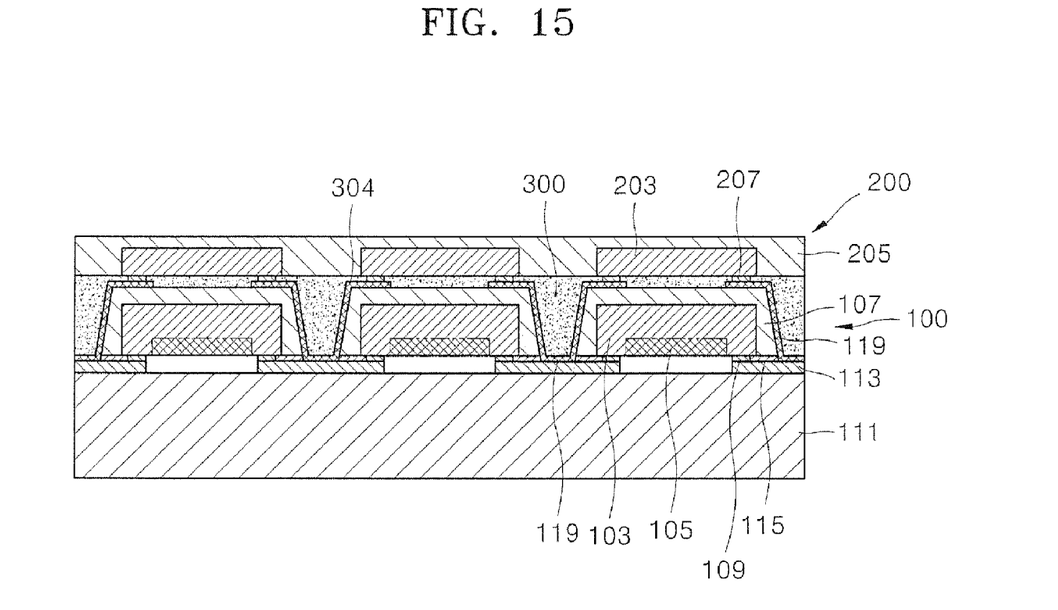

Thereafter, as illustrated in 15, the first wafer mold 100 bonded with the protection substrate 111, and the first vias 119 are mechanically bonded with the second wafer mold 200 using the second adhesive layer 300. Thus, the second pads 207 are electrically connected to the wiring layers 113 of the protection substrate 111 through the first vias 119, respectively. When the first wafer mold 100 bonded to the protection substrate 111, and the second wafer mold 200 are mechanically bonded, the second adhesive layer 300 is embedded in the first via holes 117.

In FIGS. 14 and 15, the first chip 103 and the second chip 203 have the same size. However, since the first wafer mold 100 and the second wafer mold 200 are bonded using the second adhesive layer 300 in the present invention, changing lengths of the first vias 119 on the surface of the first wafer mold 100, and positions of the second pads 207 may allow easy bonding between the first and second wafer molds 100 and 200 even if the first chips 103 and the second chips 103 have different sizes. In addition, if the first chips 103 are normal chips, not image sensor chips, the protection substrate 111 may be thin as illustrated in FIG. 4.

Figure 16:
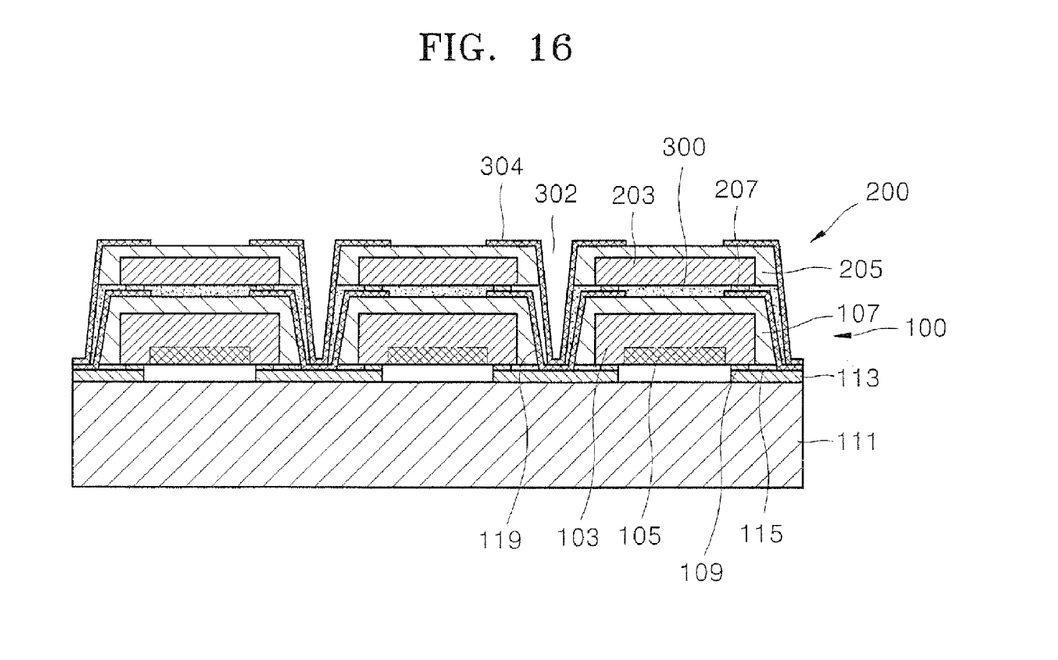

Referring to FIG. 16, the second mold layer 205 of the second wafer mold 200 and the second adhesive layer 300 are selectively etched to form second via holes 302 exposing the wiring layers 113. The selective etching of the second mold layer 205 and the second adhesive layer 300 is performed using laser processing, for example, excimer laser processing, or dry etching.

Thereafter, second vias 304 are formed on inner surfaces of the second via holes 302 and portions of the wiring layers 113 and the second mold layer 205. The second vias 304 are formed by forming a copper layer to a thickness of about 2 to 5 µm using electroless plating, and patterning the copper layer through a photolithography process. In such a manner, the wiring layer 113 and the second via 304 are electrically connected. If the first chip 103 and the second chip 203 have different sizes, the second via 304 is formed with reference to a larger chip. The second via 304 is perpendicularly connected to the wiring layer 113.

Figure 17:
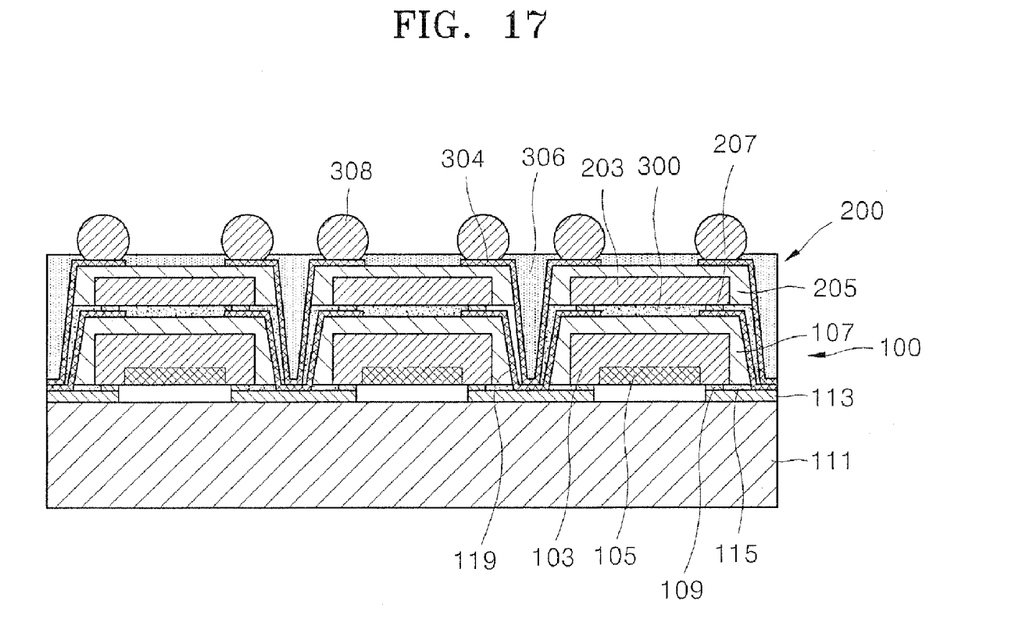

As illustrated in FIG. 17, a solder resist layer 306 is formed, which is embedded in the second via holes 302 while exposing the second vias 304 exposed on a surface of the second wafer mold 200. The solder resist layer 306 is formed using screen-printing or film lamination. Thereafter, external connection terminals 308 for connection with an external circuit are formed on the second vias 304, respectively. The external connection terminals 308 may be a solder ball type or a solder bump type. The external connection terminals 308 may be formed of, for example, Au or solder, or materials such as Sn/Pb, Sn/Ag, and Sn/Ag/Cu.

Figure 18:
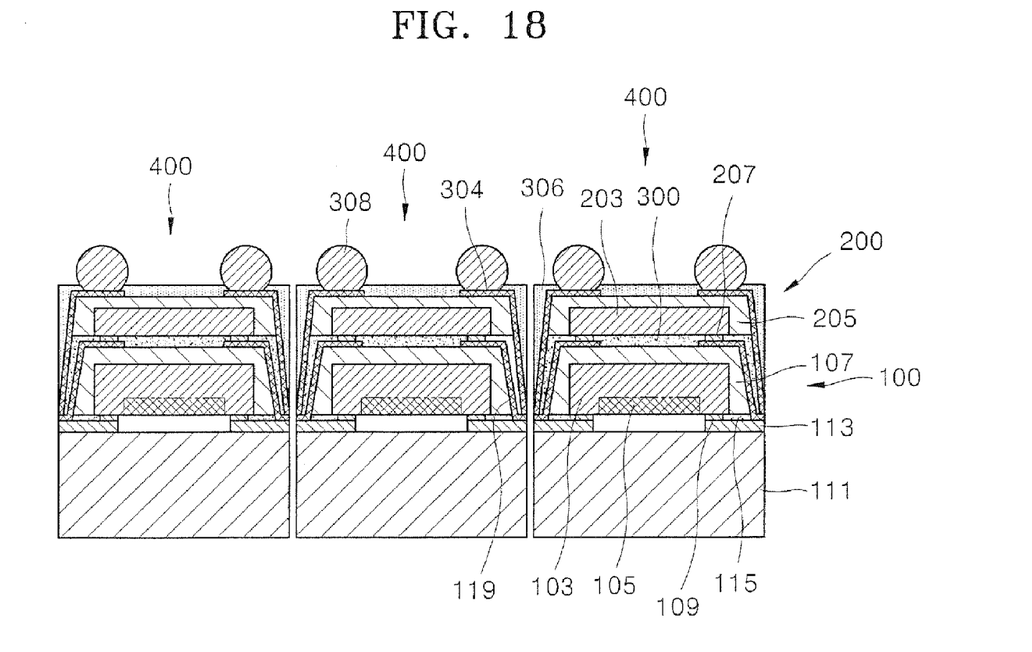

As illustrated in FIG. 18, the first and second wafer mold 100 and 200, and the protection substrate 110 are diced for each set of first and second chips 103 and 203, so that individual packages of a wafer level chip size package type are fabricated.

According to the present invention, different types of chips are directly connected without using wire bonding, so that performance can be improved, and package miniaturization can be achieved.

According to the present invention, different types of chips are constructed into wafer molds, the wafer molds are stacked in a wafer level, and vias are formed on both sidewalls of the wafer molds to connect the different types of chips. Thus, the stack type semiconductor chip package can be easily fabricated, even in the case of different types of chips with different sizes.

According to the present invention, a first wafer mold including an image sensor chip is bonded with a protection substrate using an adhesive layer, so that a package is prevented from being contaminated by impurity particles such as dust. Also, the first wafer mold bonded with the protection substrate, and a second wafer mold including an image signal processor are bonded using an adhesive layer. Thus, an image sensor chip package, a chip scale package, can be easily fabricated.

According to the present invention, only good chips are used in the packaging process, excluding defective chips, and chips without vias therein are used for packaging, so that a high-yield fabrication process of a stack type semiconductor chip package can be achieved.

According to an aspect of the present invention, there is provided a stack type semiconductor chip package including a first wafer mold, a protection substrate, and a second wafer mold that are stacked in a wafer level process. The first wafer mold includes a first chip having first pads on one surface, and a first mold layer surrounding and encapsulating the first chip. The protection substrate is placed on the first wafer mold, is mechanically bonded with the first wafer mold using a first adhesive layer interposed therebetween, and includes wiring layers on one surface facing the first pads to be electrically connected to the first wafer mold.

The second wafer mold may be placed under the first wafer mold, is mechanically bonded with the first wafer mold using a second adhesive layer interposed therebetween, and includes a second chip having second pads, and a second mold layer surrounding and encapsulating the second chip. The first chip and the second chip may be different types of chips with different functions and sizes. First vias electrically connecting the wiring layers of the protection substrate with the second pads of the second wafer mold are placed along both sidewalls of the first wafer mold. The first vias may be formed on both sidewalls and a surface of the first mold layer of the first wafer mold, and the wiring layer of the protection substrate.

Second vias may electrically connect the wiring layers of the protection substrate with external connection terminals. The second vias may be spaced apart from the first vias, and be formed on both sidewalls of the first and second mold layers of the first and second wafer molds, a bottom surface of the second mold layer, and the wiring layers of the protection substrate. The first chip may be an image sensor chip including, at a center portion of an upper surface, an image sensing unit in which the first pads are placed at both sides of the image sensing unit, the protection substrate may be a transparent substrate, and the second chip may be an image signal processor.

The first adhesive layer may be a nonconductive film or an anisotropic conductive film formed on the wiring layers. The second adhesive layer may be a nonconductive film or an anisotropic conductive film formed between a bottom surface of the first wafer mold and the second chip of the second wafer mold. A solder resist layer may be further formed on outer sides of the second vias formed on both sidewalls of the first and second wafer molds, and a bottom surface of the second wafer mold.

According to another aspect of the present invention, a first wafer mold including a plurality of first chips that are spaced apart from each other and having first pads on one set of surfaces, and a first mold layer that surrounds and encapsulates the first chips is prepared. The first wafer mold may be completed by placing the plurality of first chips on a base film at predetermined intervals therebetween, forming the first mold layer surrounding and encapsulating the first chips on the base film and the first chips, and removing the base film to expose the first pads formed on one set of surfaces of the first chips.

The first wafer mold may be mechanically bonded with a protection substrate including wiring layers on one surface facing the first pads to electrically connect the first pads and the wiring layers. The first mold layer of the first wafer mold, and the first adhesive layer may be selectively etched to form first vias connected to the wiring layers. The first vias may be completed by selectively etching the first mold layer of the first wafer mold, and the first adhesive layer to form first via holes exposing the wiring layers, and forming a metal pattern for the first vias on inner walls of the first via holes, and portions of surfaces of the wiring layer and the first mold layer.

A second wafer mold including a plurality of second chips that have second pads on one surface and a second mold layer that surrounds and encapsulates the second chips may be prepared. The first wafer mold bonded on the protection substrate may be mechanically bonded with the second wafer mold using a second adhesive layer in a wafer level process to electrically connect the second pads of the second wafer mold with the wiring layers of the protection substrate through the first vias. The second mold layer of the second wafer mold and the second adhesive layer may be selectively etched to form second vias connected to the wiring layers. The second vias may be completed by selectively etching the second mold layer of the second wafer mold, and the second adhesive layer to expose the wiring layers, and forming a metal pattern for the second vias on inner walls of the second via holes, and portions of surfaces of the wiring layers and the second mold layer.

External connection terminals connected to the wiring layers of the protection substrate through the second vias may be formed. The external connection terminal may be completed by forming a solder resist layer embedded in the second via holes and exposing the second vias formed on a surface of the second wafer mold, and forming solder balls on the second vias. The first and second wafer molds and the protection substrate may be diced for each set of the first and second chips to form individual packages of a wafer level chip size.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A stack type semiconductor chip package comprising:
a first wafer mold including a first chip having first pads on one surface and a first mold layer surrounding and encapsulating the first chip;
a protection substrate disposed on the first wafer mold and mechanically bonded with the first wafer mold using a first adhesive layer interposed therebetween, the protection substrate having wiring layers on one surface facing the first pads and electrically connected to the first wafer mold;
a second wafer mold disposed under the first wafer mold and mechanically bonded with the first wafer mold using a second adhesive layer interposed therebetween, the second wafer mold including a second chip having second pads and a second mold layer surrounding and encapsulating the second chip;
first vias disposed on the sidewalls of the first wafer mold and electrically connecting the wiring layers of the protection substrate with the second pads of the second wafer mold; and
second vias electrically connecting the wiring layers of the protection substrate with external connection terminals.

2. The package of claim 1, wherein the first chip and the second chip are different from each other in one or more of type of chip, function, and size.

3. The package of claim 1, wherein the first chip is an image sensor chip including an image sensing unit at a center portion of an upper surface, the protection substrate is a transparent substrate, and the second chip is an image signal processor, wherein the first pads are placed at both sides of the image sensing unit.

4. The package of claim 1, wherein the first adhesive layer is a nonconductive film or an anisotropic conductive film disposed on the wiring layers.

5. The package of claim 1, wherein the second adhesive layer is a nonconductive film or an anisotropic conductive film disposed between a bottom surface of the first wafer mold and the second chip of the second wafer mold.

6. The package of claim 1, wherein the first vias are disposed on both sidewalls and a bottom surface of the first mold layer of the first wafer mold and the wiring layer of the protection substrate.

7. The package of claim 1, wherein the second vias are spaced apart from the first vias and are disposed on both sidewalls of the first and second mold layers of the first and second wafer molds, a bottom surface of the second mold layer, and the wiring layers of the protection substrate.

8. The package of claim 1, further comprising a solder resist layer disposed on outer sides of the second vias and a bottom surface of the second wafer mold.

9. A stack type semiconductor chip package comprising:
a first wafer mold including a first chip having first pads on a surface thereof and a first mold layer surrounding and encapsulating the first chip;
a protection substrate placed on the first wafer mold, and mechanically bonded with the first wafer mold using a first adhesive layer interposed therebetween, the protection substrate having wiring layers on a bottom surface facing the first pads;
a second wafer mold placed under the first wafer mold, and mechanically bonded with the first wafer mold using a second adhesive layer, the second wafer mold including a second chip having second pads on a surface and a second mold layer surrounding and encapsulating the second chip;

first vias disposed on both sidewalls and a surface of the first mold layer of the first wafer mold and the wiring layers of the protection substrate, the first vias electrically connecting the wiring layers of the protection substrate with the second pads of the second wafer mold; and second vias spaced apart from the first vias by the second adhesive layer and disposed on both sidewalls of the first and second mold layers, a surface of the second mold layer, and the wiring layers of the protection substrate, the second vias electrically connecting the wiring layers with external connection terminals.

10. The package of claim 9, wherein the first chip and the second chip are different from each other in one or more of type of chip, function, and size.

11. The package of claim 9, wherein the first chip is an image sensor chip including an image sensing unit at a center portion of an upper surface, the protection substrate is a transparent substrate, and the second chip is an image signal processor, wherein the first pads are placed at both sides of the image sensing unit.

* * * * *

UNITED STATES PATENT AND TRADEMARK OFFICE
CERTIFICATE OF CORRECTION

| | | |
|---|---|---|
| PATENT NO. | : 7,619,315 B2 | Page 1 of 1 |
| APPLICATION NO. | : 11/952426 | |
| DATED | : November 17, 2009 | |
| INVENTOR(S) | : Woon-Seong Kwon et al. | |

It is certified that error appears in the above-identified patent and that said Letters Patent is hereby corrected as shown below:

Column 6, line 43, the word "FIG. 1," should read -- FIG. 11, --.

Signed and Sealed this

Ninth Day of March, 2010

David J. Kappos
*Director of the United States Patent and Trademark Office*